(12) United States Patent
Wang (10) Patent No.: US 10,847,752 B2
(45) Date of Patent: Nov. 24, 2020

(54) DISPLAY PANEL

(71) Applicant: Wuhan China Star Optoelectronics Semiconductor Display Technology Co., Ltd., Wuhan (CN)

(72) Inventor: Kun Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/340,144

(22) PCT Filed: Mar. 21, 2019

(86) PCT No.: PCT/CN2019/078950
§ 371 (c)(1),
(2) Date: Apr. 8, 2019

(87) PCT Pub. No.: WO2020/143115
PCT Pub. Date: Jul. 16, 2020

(65) Prior Publication Data
US 2020/0321556 A1 Oct. 8, 2020

(30) Foreign Application Priority Data

Jan. 10, 2019 (CN) .......................... 2019 1 0023052

(51) Int. Cl.
*H01L 51/52* (2006.01)
*H01L 51/56* (2006.01)
(Continued)

(52) U.S. Cl.
CPC ...... *H01L 51/5256* (2013.01); *H01L 27/3283* (2013.01); *H01L 51/5253* (2013.01);
(Continued)

(58) Field of Classification Search
CPC ............. H01L 27/3246; H01L 27/3283; H01L 27/3295; H01L 33/54; H01L 33/56;
(Continued)

(56) References Cited

U.S. PATENT DOCUMENTS 9,093,651 B2 * 7/2015 Lee ...................... H01L 27/3241
9,385,331 B2 * 7/2016 Jang ..................... H01L 51/0097
(Continued)

FOREIGN PATENT DOCUMENTS

CN 104124258 10/2014
CN 105576000 5/2016
(Continued)

*Primary Examiner* — Stephen W Smoot (57) ABSTRACT

Disclosed is a display panel, including a display device board and an encapsulation layer; the display device board includes a display area and a peripheral area; the encapsulation layer includes a first organic layer, a first inorganic layer, a second organic layer and a second inorganic layer, and the first organic layer includes at least two annular members, and the annular member includes four strip members, and the strip member covers at least a portion of a pixel unit of the display device board, and the first inorganic layer, the second organic layer and the second inorganic layer are sequentially stacked.

19 Claims, 7 Drawing Sheets

(51) Int. Cl.
*H01L 27/32* (2006.01)
*H01L 51/00* (2006.01)

(52) U.S. Cl.
CPC .......... *H01L 51/56* (2013.01); *H01L 27/3246* (2013.01); *H01L 51/0097* (2013.01); *H01L 2251/5338* (2013.01)

(58) Field of Classification Search
CPC ............. H01L 51/0097; H01L 51/5237; H01L 51/5253; H01L 51/5256; H01L 2251/5338
See application file for complete search history.

(56) References Cited

U.S. PATENT DOCUMENTS

| | | | |
|---|---|---|---|
| 2014/0319474 A1 | 10/2014 | Kim et al. | |
| 2015/0034935 A1 | 2/2015 | Choi | |
| 2016/0126496 A1 | 5/2016 | Wang et al. | |
| 2017/0062537 A1* | 3/2017 | Kim | H01L 27/3248 |
| 2017/0115438 A1* | 4/2017 | Choi | H01L 51/5281 |
| 2018/0070460 A1* | 3/2018 | Han | G06F 1/1652 |
| 2018/0076230 A1* | 3/2018 | Kwak | H01L 51/56 |
| 2018/0226617 A1* | 8/2018 | Nakagawa | H01L 51/0097 |
| 2019/0074459 A1* | 3/2019 | Kim | H01L 51/0017 |
| 2019/0198586 A1* | 6/2019 | Kim | H01L 27/3246 |
| 2019/0363284 A1* | 11/2019 | Yasuda | H01L 51/0097 |
| 2020/0052230 A1* | 2/2020 | Jin | H01L 51/5237 |
| 2020/0127235 A1* | 4/2020 | Cao | H01L 51/0097 |
| 2020/0168670 A1* | 5/2020 | Kim | H01L 27/3246 |

FOREIGN PATENT DOCUMENTS

| | | |
|---|---|---|
| CN | 106876612 | 6/2017 |
| CN | 107689425 | 2/2018 |

\* cited by examiner

DISPLAY PANEL

RELATED APPLICATIONS

This application is a National Phase of PCT Patent Application No. PCT/CN2019/078950 having International filing date of Mar. 21, 2019, which claims the benefit of priority of Chinese Patent Application No. 201910023052.3 filed on Jan. 10, 2019. The contents of the above applications are all incorporated by reference as if fully set forth herein in their entirety.

FIELD AND BACKGROUND OF THE INVENTION

The present invention relates to a display technology field, and more particularly to a display panel.

Foldable screens possess wide application prospects. Currently, more and more manufacturers are trying to develop foldable screens.

Foldable screens require a bendable number of commercial grades, and the fold resistant performance of the foldable screen needs to achieve a higher level.

The improvement of the fold resistance of the conventional foldable screen partially depends on the improvement of the fold resistance of the encapsulation layer, and is limited by the construction of the encapsulation layer of the conventional foldable screen. The stress cannot be effectively alleviated when the traditional bendable screen is bent, so the overall fold resistance of the conventional foldable screen is low.

Consequently, there is a need to provide a new technical solution for solving the aforesaid technical problem.

SUMMARY OF THE INVENTION

An objective of the present invention is to provide a display panel which can effectively improve a bending resistance of the display panel.

To solve the aforesaid problem, the technical solution of the present invention is described as follows:

a display panel, including: a display device board, including a display area and a peripheral area on at least one side of the display area; an encapsulation layer, including a first organic layer, a first inorganic layer, a second organic layer and a second inorganic layer, wherein the first organic layer is disposed on a portion of the display device board corresponding to the display area, and the first organic layer includes at least two annular members, and the annular member includes four strip members, and the strip member covers at least a portion of a pixel unit of the display device board, and the first inorganic layer, the second organic layer and the second inorganic layer are sequentially stacked, and the first inorganic layer covers the first organic layer; wherein a line shape corresponding to the strip member is one of a straight line, a zigzag line, a fold line and a wavy line; a width of the strip member is greater than or equal to a width of the pixel unit; a surface of the annular member away from the display device board is a convex curved surface.

In the aforesaid display panel, the at least two of the annular members include a first annular member and a second annular member, and the first annular member surrounds the second annular member.

In the aforesaid display panel, the first inorganic layer is disposed on the annular members and a portion of the display device board that is not covered by the annular members.

A display panel, including: a display device board, including a display area and a peripheral area on at least one side of the display area; an encapsulation layer, including a first organic layer, a first inorganic layer, a second organic layer and a second inorganic layer, wherein the first organic layer is disposed on a portion of the display device board corresponding to the display area, and the first organic layer includes at least two annular members, and the annular member includes four strip members, and the strip member covers at least a portion of a pixel unit of the display device board, and the first inorganic layer, the second organic layer and the second inorganic layer are sequentially stacked, and the first inorganic layer covers the first organic layer.

In the aforesaid display panel, a line shape corresponding to the strip member is one of a straight line, a zigzag line, a fold line and a wavy line.

In the aforesaid display panel, a width of the strip member is greater than or equal to a width of the pixel unit.

In the aforesaid display panel, the at least two of the annular members include a first annular member and a second annular member, and the first annular member surrounds the second annular member.

In the aforesaid display panel, a width of the strip member of the first annular member is equal to a width of the strip member of the second annular member.

In the aforesaid display panel, a width of the strip member of the first annular member is greater than or smaller than a width of the strip member of the second annular member.

In the aforesaid display panel, the first inorganic layer is disposed on the annular members and a portion of the display device board that is not covered by the annular members.

In the aforesaid display panel, a surface of the annular member away from the display device board is a convex curved surface.

In the aforesaid display panel, a height of the strip members is in a range of 1 micrometer to 15 micrometers.

In the aforesaid display panel, a width of the strip members is in a range of 10 micrometer to 500 micrometers.

In the aforesaid display panel, the strip members are arranged equidistantly in a same direction.

In the aforesaid display panel, at least a portion of the strip member fills a recess on the display device board corresponding to the pixel unit.

In the aforesaid display panel, a thickness of the second organic layer at a position corresponding to the strip members is greater than or equal to 0 micrometer.

In the aforesaid display panel, the annular member is formed by spraying a first organic material in the display area of the display device board using a spraying device.

In the aforesaid display panel, the first inorganic layer is formed by depositing a first inorganic material on the annular members and a portion of the display device board that is not covered by the annular members.

In the aforesaid display panel, the second organic layer is formed by coating a second organic material on the first inorganic layer and a portion of the display device board that is not covered by the first inorganic layer.

In the aforesaid display panel, the second inorganic layer is formed by depositing a second inorganic material on the second organic layer.

In the present invention, since the first organic layer in the encapsulation layer includes at least two annular members, and the annular member includes four strip members covering at least a portion of the pixel unit of the display device board, and the first inorganic layer, the second organic layer and the second inorganic layer are sequentially stacked on the first organic layer, when the display panel is folded, the encapsulation layer can relieve the stress between the plurality of strip members. For instance, the encapsulating layer is capable of releasing the stress from one strip member to the other strip member along the length direction of the strip member, or releasing the stress from one strip member to another strip member having a gap therebetween. Therefore, the technical solution of the invention can effectively improve the fold resistance of the display panel.

For a better understanding of the aforementioned content of the present invention, preferable embodiments are illustrated in accordance with the attached figures for further explanation.

DESCRIPTION OF SPECIFIC EMBODIMENTS OF THE INVENTION

The word, "an embodiment" used in this specification means serving as an example, an instance, or an illustration. Besides, in this specification and the appended claims, the articles "a" generally means "one or more" unless specified otherwise or the singular form can be clearly confirmed in the context.

Figure 1:
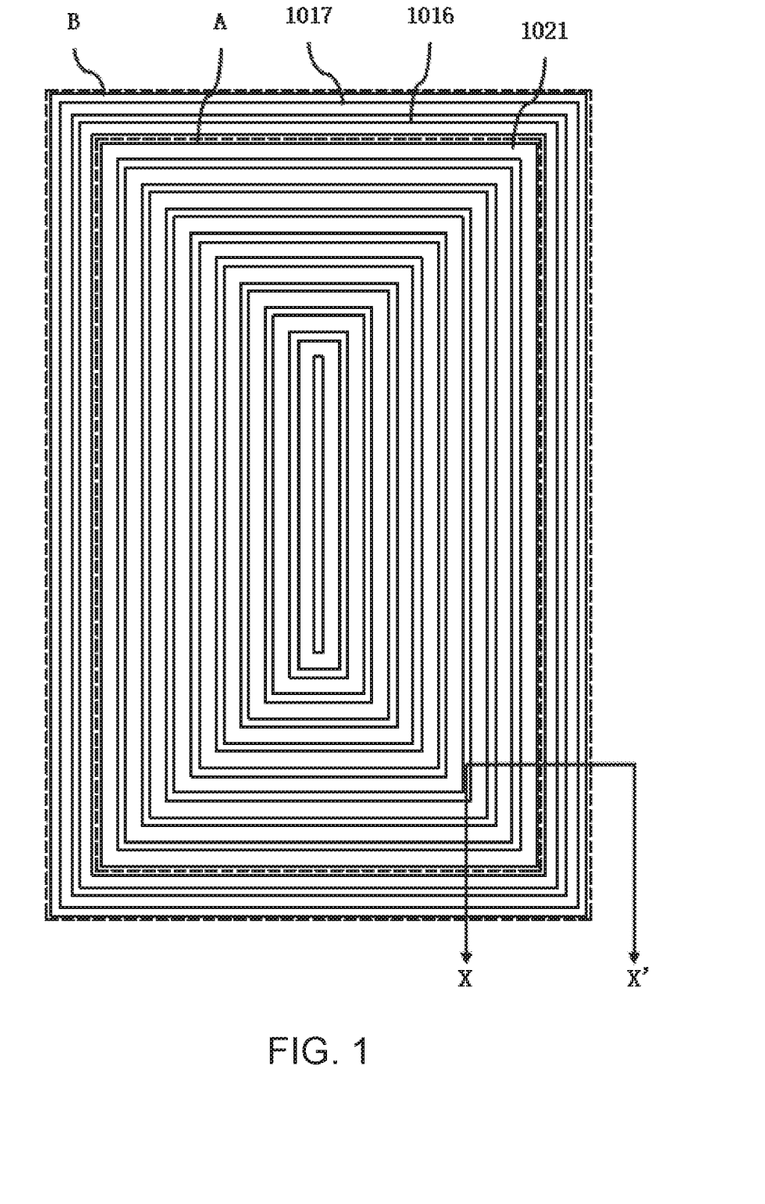
FIG. 1 is a diagram of a first embodiment of a display panel of the present invention.
Figure 2:
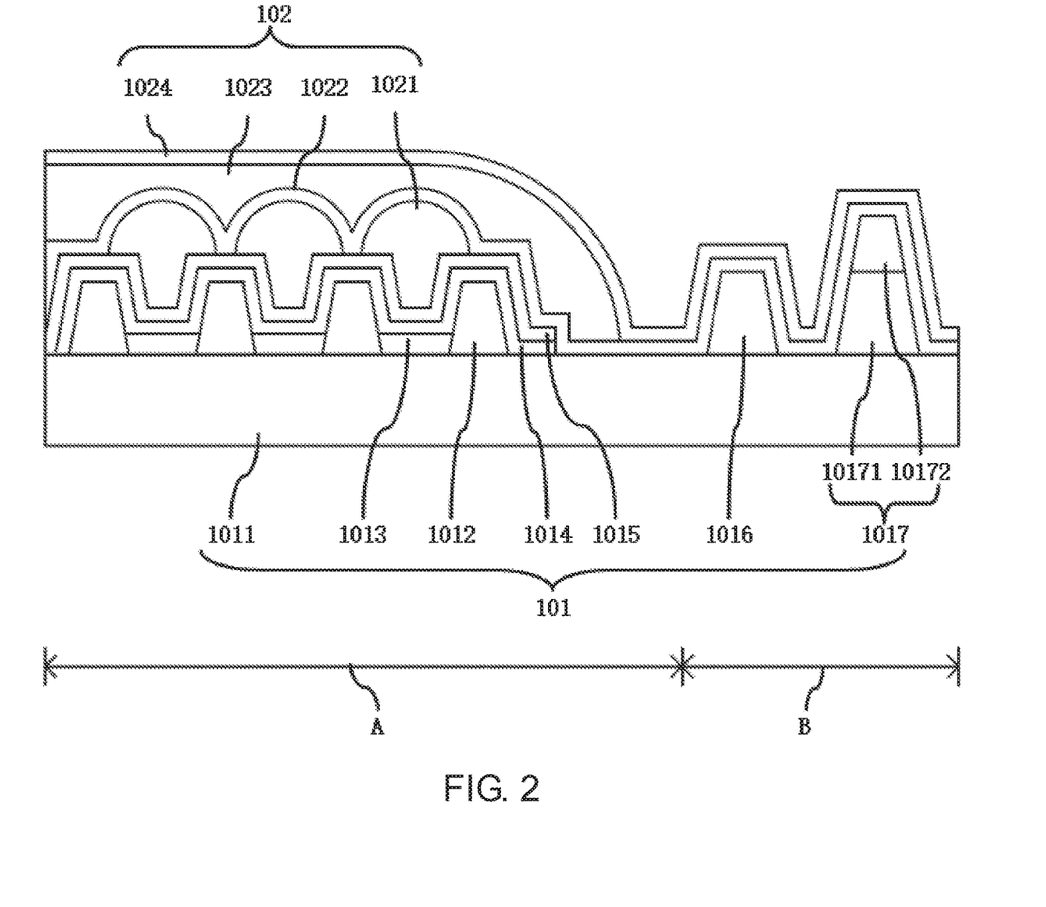
FIG. 2 is a first diagram of the X-X' section of FIG. 1.
Figure 3:
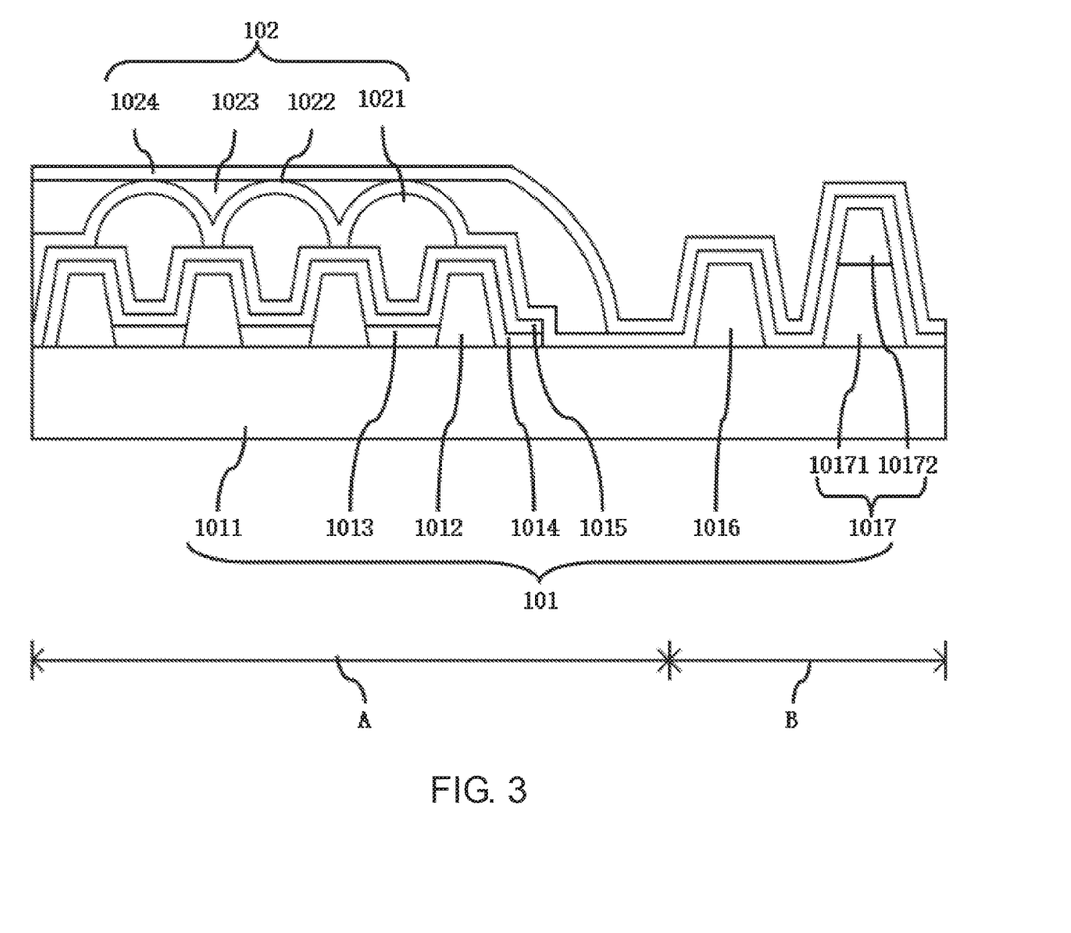
FIG. 3 is a second diagram of the X-X' section of FIG. 1.
Figure 4:
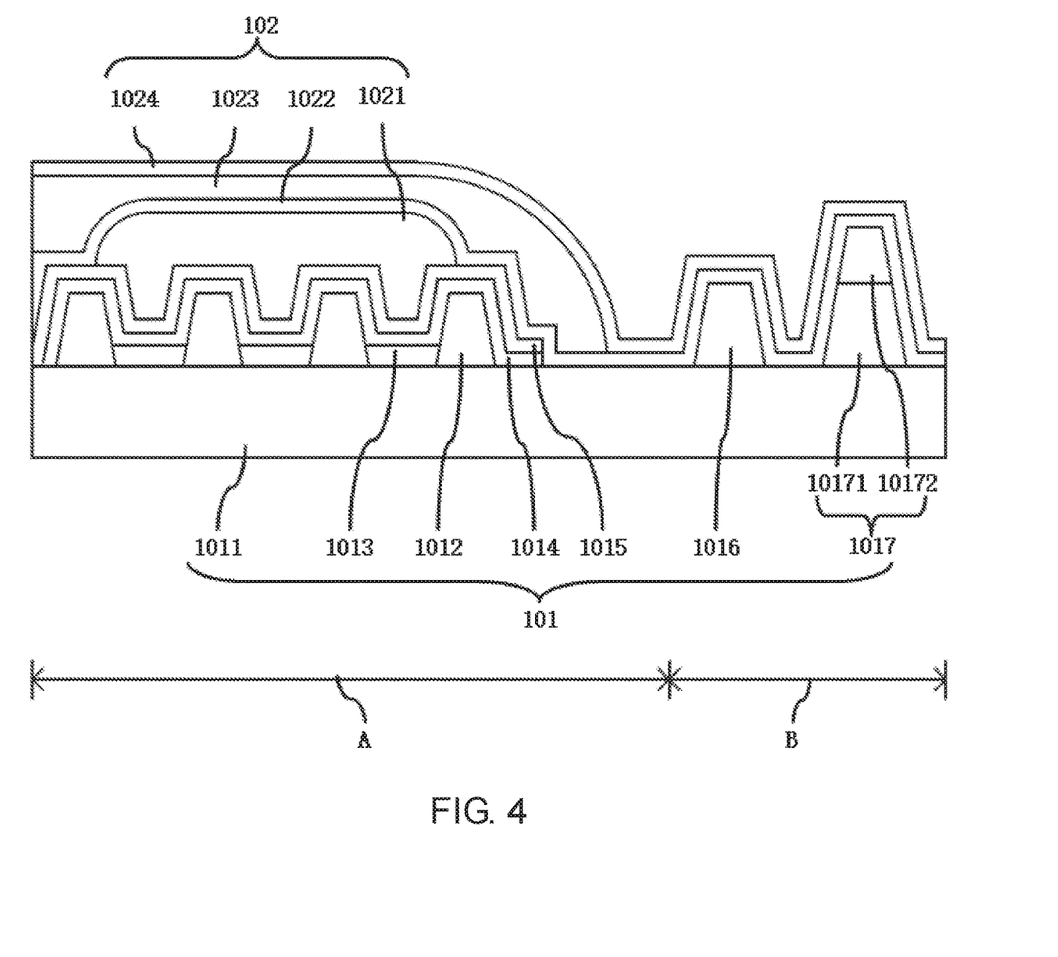
FIG. 4 is a third diagram of the X-X' section of FIG. 1.
Figure 5:
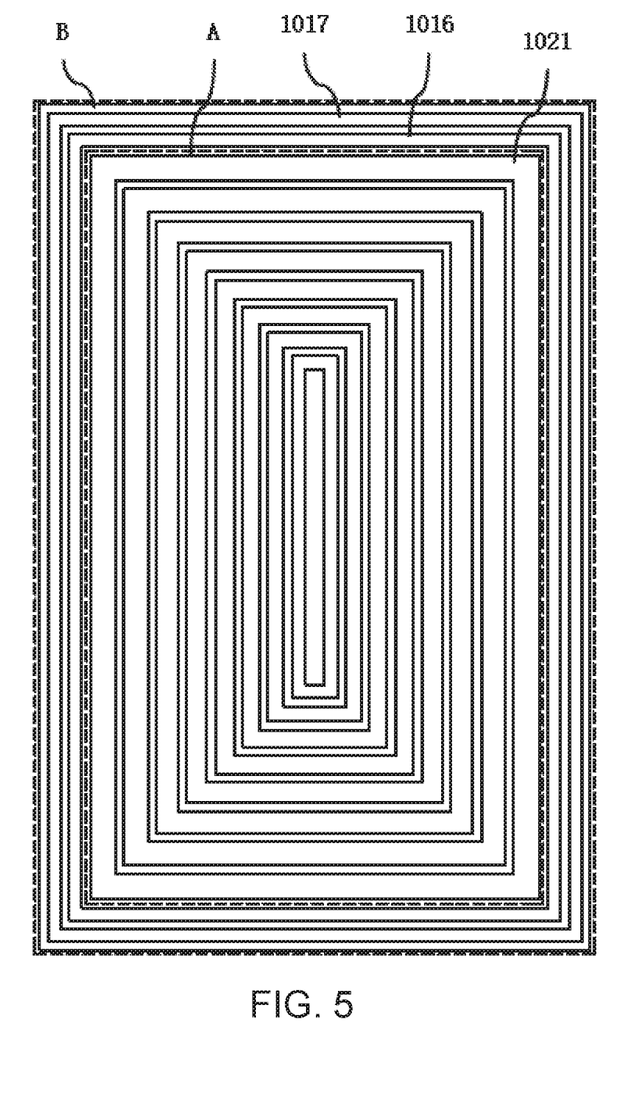
FIG. 5 is a diagram showing that a width of a strip member gradually decreases from the outer side to the inner side in the first embodiment of the display panel of the present invention.

Please refer to FIG. 1 to FIG. 5. FIG. 1 is a diagram of a first embodiment of a display panel of the present invention. FIG. 2 is a first diagram of the X-X' section of FIG. 1. FIG. 3 is a second diagram of the X-X' section of FIG. 1. FIG. 4 is a third diagram of the X-X' section of FIG. 1. FIG. 5 is a diagram showing that a width of a strip member gradually decreases from the outer side to the inner side in the first embodiment of the display panel of the present invention.

The display panel of this embodiment may be an OLED (Organic Light Emitting Diode) as an illustration.

The display panel of this embodiment includes a display device board 101 and an encapsulation layer 102.

The display device board 101 includes a display area A and a peripheral area B on at least one side of the display area A. The display device board 101 includes a flexible substrate 1011, a buffer layer (not shown), a scan line (not shown), a data line (not shown), and a thin film transistor switch (not shown in the drawing), a planarization layer (not shown), a pixel defining layer 1012, an anode (not shown), an organic light emitting material layer 1013, a cathode 1014 and a cover layer 1015. The scan line and the data line are both connected to the thin film transistor switch, and the thin film transistor switch is also connected to the anode, and the organic light emitting material layer 1013 is disposed between the anode and the cathode 1014. A pixel unit composed of the thin film transistor switch, the anode, the organic light emitting material layer 1013 and the cathode 1014 is disposed in the display area A. The first inorganic layer 1022, the second organic layer 1023 and the second inorganic layer 1024 are sequentially stacked. Meanwhile, the first inorganic layer 1022 is disposed on the first organic layer 1021 and a portion of the display device board 101 that is not covered by the first organic layer 1021.

A material of the cover layer 1015 may be lithium fluoride (LiF) for illustration.

The pixel unit is located in the display area A, and the color corresponding to the pixel unit is one of red, green and blue. The pixel defining layer 1012 is disposed between the organic light emitting material layers 1013 of two adjacent pixel units.

The portion of the display device board 101 located in the peripheral area B is provided with retaining walls. The retaining walls include a first retaining wall 1017 and a second retaining wall 1016. The first retaining wall 1017 and the second retaining wall 1016 are both annular, and the first retaining wall 1017 surrounds the second retaining wall 1016. The second retaining wall 1016 surrounds the annular member. The first retaining wall 1017 includes a first wall 10171 and a second wall 10172. The second wall 10172 is disposed on the first wall 10171. A material of the first wall 10171 is the same as a material of the flat layer. The first wall 10171 is formed with the planarization layer by the same process in the process of forming the planarization layer.

A material of the second retaining wall 1016 and a material of the second wall 10172 are the same as a material of the pixel defining layer 1012. The second retaining wall 1016 and the second wall 10172 of the first retaining wall 1017 are formed with the pixel defining layer 1012 by the same process in the process of forming the pixel defining layer 1012.

The encapsulation layer 102 includes a first organic layer 1021, a first inorganic layer 1022, a second organic layer 1023 and a second inorganic layer 1024. The first organic layer 1021 is disposed on a portion of the display device board 101 corresponding to the display area A, and the first organic layer 1021 includes at least two annular members, and the annular member includes four strip members. The strip member covers at least a portion of the pixel unit of the display device board 101. The first inorganic layer 1022, the second organic layer 1023 and the second inorganic layer 1024 are sequentially stacked, and the first inorganic layer 1022 covers the first organic layer 1021.

Four of the strip members in the annular member are connected end to end in an annular shape.

The annular member (i.e. the patterned first organic layer 1021) is formed by spraying a first organic material in the display area A of the display device board 101 using a spraying device.

At least a portion of the strip member fills a recess on the display device board 101 corresponding to the pixel unit.

The annular member having elasticity is used for mitigating stress generated by the display panel due to bending, and causing the stress to spread along a direction of the line corresponding to the strip member. Thereby, the fold resistance of the display panel is improved, and the failure risk of the fold position of the display panel is reduced.

In practice, when the annular member covers more pixel units, the stronger the ability of the first organic layer 1021 to mitigate the stress generated by the display panel during the folding process, the higher the fold resistance of the display panel.

In this embodiment, a line shape corresponding to the strip member is a straight line.

The density of the strip members and the width of the corresponding line shape can be determined according to the spraying accuracy of the spraying device and the nozzle size.

The strip members are arranged equidistantly in the same direction.

In the case where the line shape corresponding to the strip member is a straight line, the strip member covers at least a portion of the pixel unit in the first direction.

As an improvement, the strip member possesses an extending contact claw, and the extending contact claw extends from a side of a main body portion of the strip member out of the main body portion of the strip member. The extending contact claw is in close contact with at least one of a flat surface, a sloped surface and an uneven surface of the display device board, and the extending contact claw may be a line shape or a curved shape.

The width of the strip member is equal to the width of one of the pixel units, as shown in FIG. 1, or the width of the strip member is greater than the width of one of the pixel units, as shown in FIG. 4.

In practice, it has been verified that: as the width of the strip member is equal to the width of the pixel unit (i.e., the first organic material sprayed by the spraying device in the display area A of the display device board 101 covers only the width of a single pixel unit (i.e., a sub-pixel)), the display panel possesses the highest fold resistance.

The at least two of the annular members include a first annular member and a second annular member. The first strip member is located between the second strip member and an edge portion of the display device board 101, and the first annular member surrounds the second annular member.

A width of the strip member of the first annular member is equal to a width of the strip member of the second annular member; or a width of the strip member of the first annular member is greater than or smaller than a width of the strip member of the second annular member.

Namely, from the edge of the display area A to the center of the display area A, the widths of the strip members of adjacent two annular members are equal; or, the widths of the strip members of the annular member gradually decreases (as shown in FIG. 5) or gradually increases from the edge of the display area A to the center of the display area A.

The first inorganic layer 1022 is disposed on the annular members and a portion of the display device board 101 that is not covered by the annular members. The first inorganic layer 1022 further covers a portion of the display device board 101 located in the peripheral area B. Specifically, the first inorganic layer 1022 further covers retaining walls disposed in the peripheral area B and a portion of the display device board 101 that is not covered by the retaining walls.

The first inorganic layer 1022 is formed by depositing a first inorganic material on the annular members and a portion of the display device board 101 that is not covered by the annular members by an atomic layer deposition (ALD) process, a laser pulse deposition (PLD) process, a sputtering process or a plasma enhanced chemical vapor deposition (PECVD) process. The first inorganic material may be, for example, SiNx, SiOxNy, SiOx, SiCxNy, ZnO or AlOx.

Since the first inorganic layer 1022 covers the first inorganic layer 1022 and the retaining walls located in the peripheral area B, a gap is formed between two annular members of the first inorganic layer 1022, and there is also a gap between the two retaining walls. Therefore, a contact area of the encapsulation layer 102 and the display device board 101 can be increased, and the ability of the display panel to relieve stress during the folding process can be improved, thereby improving the fold resistance of the display panel.

A surface of the annular member away from the display device board 101 is a convex curved surface.

A height of the strip members is in a range of 1 micrometer to 15 micrometers. For instance, the height is 1 micrometer, 2 micrometers, 3 micrometers, 4 micrometers, 5 micrometers, 6 micrometers, 7 micrometers, 8 micrometers, 9 micrometers, 10 micrometers, 11 micrometers, 12 micrometers, 13 micrometers, 14 micrometers or 15 micrometers. The height refers to the length from one end to the other end of the cross section of the strip member in a direction perpendicular to a plane corresponding to the display device board 101.

A width of the strip members is in a range of 10 micrometer to 500 micrometers. For instance, the width of the strip members is 10 micrometers, 30 micrometers, 50 micrometers, 70 micrometers, 90 micrometers, 110 microns, 130 micrometers, 150 micrometers, 170 micrometers, 190 micrometers, 210 micrometers, 230 micrometers, 250 micrometers, 270 micrometers, 290 micrometers, 310 micrometers, 330 micrometers, 350 micrometers, 370 micrometers, 390 micrometers, 410 micrometers, 430 micrometers, 450 micrometers, 470 micrometers, 490 micrometers or 500 micrometers. The width refers to the length from one end to the other end of the cross section of the strip member in a direction parallel with a plane corresponding to the display device board 101.

A thickness of the second organic layer 1023 at a position corresponding to the strip members is greater than or equal to 0 micrometer. The height refers to the length from one end to the other end of the cross section of the second organic layer 1023 in a direction perpendicular to a plane corresponding to the display device board 101.

In case that a thickness of the second organic layer 1023 at a position corresponding to the strip members is equal to 0 micrometer, the first inorganic layer 1022 and the second inorganic layer 1024 are in contact at positions corresponding to the strip members.

The second organic layer 1023 is formed by coating a second organic material on the first inorganic layer 1022 and a portion of the display device board 101 that is not covered by the first inorganic layer 1022. The second organic material and the first organic material are the same or different organic materials.

The thickness of the second organic layer 1023 can be adjusted according to actual conditions. For instance, the surface of the second organic layer 1023 (the surface away from the display device board 101) is leveled with the top end of the first inorganic layer 1022, as shown in FIG. 3. Alternatively, the surface of the second organic layer 1023 (the surface away from the display device board 101) is higher than the top end of the first inorganic layer 1022 with a predetermined distance, as shown in FIG. 2. The surface of the second organic layer 1023 (the surface away from the display device board 101) is a flat surface.

Since the second organic layer 1023 is disposed on the surface of the first inorganic layer 1022, at least a portion of the second organic layer 1023 fills a gap between the two strip members, which is advantageous for relieving the stress generated at the display unit when the display panel is folded inward and bent outward to enhance the fold resistance of the display panel.

The second inorganic layer 1024 is formed by depositing a second inorganic material on the second organic layer 1023 by an atomic layer deposition (ALD) process, a laser pulse deposition (PLD) process, a sputtering process or a plasma enhanced chemical vapor deposition (PECVD) process. The second inorganic material may be, for example, SiNx, SiOxNy, SiOx, SiCxNy, ZnO or AlOx.

In the present invention, since the first organic layer in the encapsulation layer includes at least two annular members, and the annular member includes four strip members covering at least a portion of the pixel unit of the display device board, and the first inorganic layer, the second organic layer and the second inorganic layer are sequentially stacked on the first organic layer, when the display panel is folded, the encapsulation layer can relieve the stress between the plurality of strip members. For instance, the encapsulating layer is capable of releasing the stress from one strip member to the other strip member along the length direction of the strip member, or releasing the stress from one strip member to another strip member having a gap therebetween. Therefore, the technical solution of the invention can effectively improve the fold resistance of the display panel.

Figure 6:
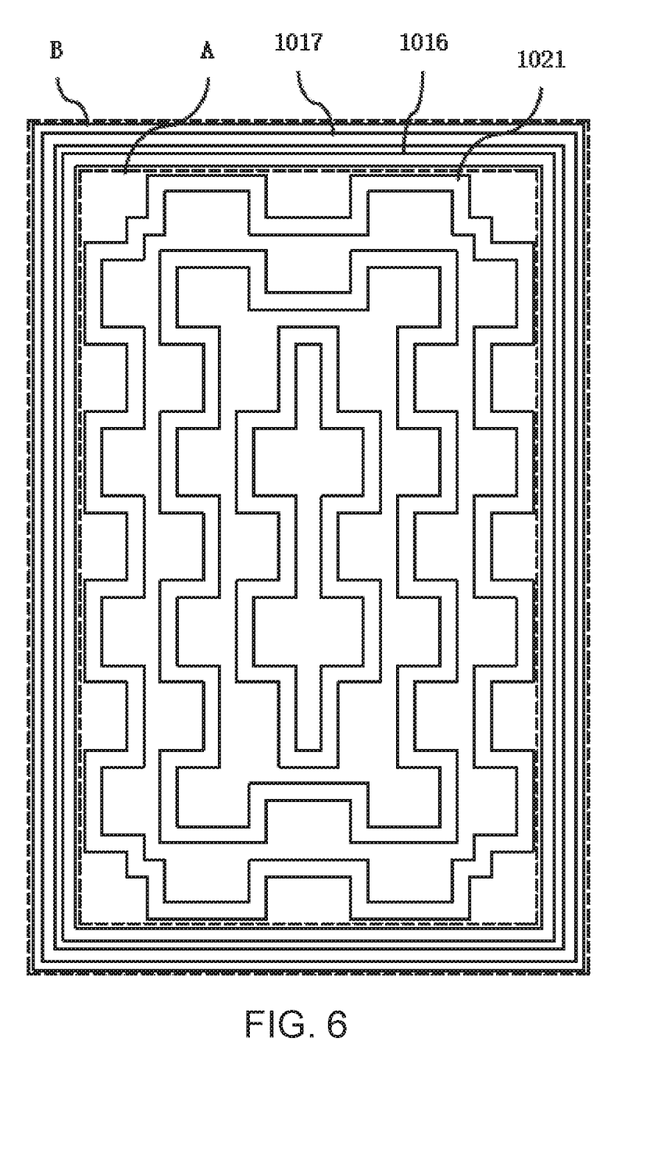
FIG. 6 is a diagram of a second embodiment of a display panel of the present invention.

Referring to FIG. 6, FIG. 6 is a diagram of a second embodiment of a display panel of the present invention. The second embodiment is similar to the first embodiment as aforementioned. The difference is:

In this embodiment, a line shape corresponding to the strip member is a zigzag line or a fold line.

In the case where the line shape corresponding to the strip member is a zigzag line or a fold line, the strip member covers at least a portion of the pixel unit in the second direction and the third direction, wherein the second direction and the third direction have an included angle greater than 0 degrees.

The line shape corresponding to the strip member is set as the zigzag line or the fold line in order to make the strip members cover more pixel areas.

Figure 7:
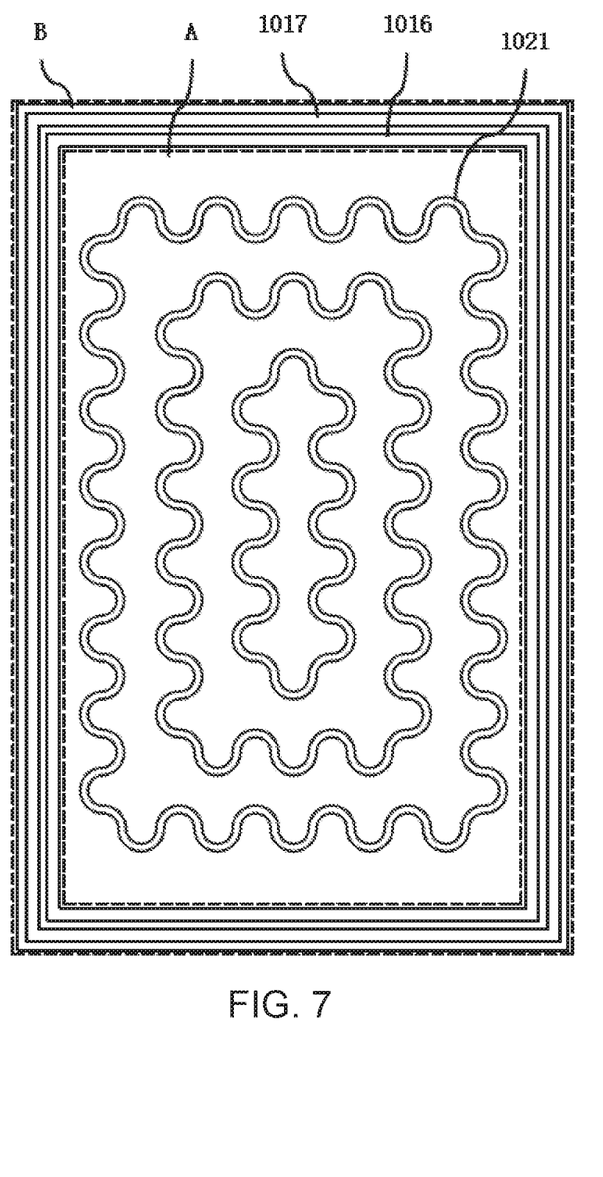
FIG. 7 is a diagram of a third embodiment of a display panel of the present invention.

Referring to FIG. 7, FIG. 7 is a diagram of a third embodiment of a display panel of the present invention. The second embodiment is similar to the first embodiment or the second embodiment as aforementioned. The difference is:

In this embodiment, a line shape corresponding to the strip member is a wavy line.

In the case where the line shape corresponding to the strip member is a wavy line, the strip member covers at least a portion of the pixel unit in the fourth direction and the fifth direction, wherein the fourth direction and the fifth direction have an included angle greater than 0 degrees.

The line shape corresponding to the strip member is set as the wavy line in order to make the strip members cover more pixel areas.

In summary, although the above preferred embodiments of the present invention are disclosed, the foregoing preferred embodiments are not intended to limit the invention, and those skilled in the art can make various kinds of alterations and modifications without departing from the spirit and scope of the present invention. Thus, the scope of protection of the present invention is defined by the scope of the claims.

What is claimed is:

1. A display panel, including:
   a display device board, including a display area and a peripheral area on at least one side of the display area;
   an encapsulation layer, including a first organic layer, a first inorganic layer, a second organic layer and a second inorganic layer, wherein the first organic layer is disposed on a portion of the display device board corresponding to the display area, and the first organic layer includes at least two annular members, and each of the annular members includes four strip members, and the strip members cover at least a portion of a pixel unit of the display device board, and the first inorganic layer, the second organic layer and the second inorganic layer are sequentially stacked, and the first inorganic layer covers the first organic layer;
   wherein a line shape corresponding to the strip members is one of a straight line, a zigzag line, a fold line, and a wavy line;
   a width of the strip members is greater than or equal to a width of the pixel unit;
   a surface of the annular members away from the display device board is a convex curved surface.

2. The display panel according to claim 1, wherein the at least two of the annular members include a first annular member and a second annular member, and the first annular member surrounds the second annular member.

3. The display panel according to claim 1, wherein the first inorganic layer is disposed on the annular members and a portion of the display device board that is not covered by the annular members.

4. A display panel, including:
   a display device board, including a display area and a peripheral area on at least one side of the display area;
   an encapsulation layer, including a first organic layer, a first inorganic layer, a second organic layer and a second inorganic layer, wherein the first organic layer is disposed on a portion of the display device board corresponding to the display area, and the first organic layer includes at least two annular members, and each of the annular members includes four strip members, and the strip members cover at least a portion of a pixel unit of the display device board, and the first inorganic layer, the second organic layer and the second inorganic layer are sequentially stacked, and the first inorganic layer covers the first organic layer.

5. The display panel according to claim 4, wherein a line shape corresponding to the strip members is one of a straight line, a zigzag line, a fold line, and a wavy line.

6. The display panel according to claim 4, wherein a width of the strip members is greater than or equal to a width of the pixel unit.

7. The display panel according to claim 4, wherein the at least two of the annular members include a first annular member and a second annular member, and the first annular member surrounds the second annular member.

8. The display panel according to claim 7, wherein a width of the strip members of the first annular member is equal to a width of the strip members of the second annular member.

9. The display panel according to claim 7, wherein a width of the strip members of the first annular member is greater than or less than a width of the strip members of the second annular member.

10. The display panel according to claim 4, wherein the first inorganic layer is disposed on the annular members and a portion of the display device board that is not covered by the annular members.

11. The display panel according to claim 4, wherein a surface of the annular members away from the display device board is a convex curved surface.

12. The display panel according to claim 4, wherein a height of the strip members is in a range of 1 micrometer to 15 micrometers.

13. The display panel according to claim 4, wherein a width of the strip members is in a range of 10 micrometer to 500 micrometers.

14. The display panel according to claim 4, wherein the strip members are arranged equidistantly in a same direction.

15. The display panel according to claim 4, wherein at least a portion of the strip members fills a recess on the display device board corresponding to the pixel unit.

16. The display panel according to claim 4, wherein the annular members are formed by spraying a first organic material in the display area of the display device board using a spraying device.

17. The display panel according to claim 4, wherein the first inorganic layer is formed by depositing a first inorganic material on the annular members and a portion of the display device board that is not covered by the annular members.

18. The display panel according to claim 4, wherein the second organic layer is formed by coating a second organic material on the first inorganic layer.

19. The display panel according to claim 4, wherein the second inorganic layer is formed by depositing a second inorganic material on the second organic layer.

* * * * *